(12) United States Patent
Liou

(10) Patent No.: US 11,568,884 B2
(45) Date of Patent: Jan. 31, 2023

(54) ANALYSIS FILTER BANK AND COMPUTING PROCEDURE THEREOF, AUDIO FREQUENCY SHIFTING SYSTEM, AND AUDIO FREQUENCY SHIFTING PROCEDURE

(71) Applicant: Invictumtech, Inc., Diamond Bar, CA (US)

(72) Inventor: Ming-Luen Liou, Taipei (TW)

(*) Notice: Subject to any disclaimer, the term of this patent is extended or adjusted under 35 U.S.C. 154(b) by 37 days.

(21) Appl. No.: 17/327,983

(22) Filed: May 24, 2021

(65) Prior Publication Data

US 2022/0383892 A1    Dec. 1, 2022

(51) Int. Cl.
*G10L 21/038* (2013.01)
*H04R 25/00* (2006.01)

(52) U.S. Cl.
CPC .......... *G10L 21/038* (2013.01); *H04R 25/353* (2013.01)

(58) Field of Classification Search
CPC .... H04B 17/364; H04B 7/005; H04B 7/0413; H04B 7/0452; H04B 10/25752; H04B 10/532; H04B 3/46; H04L 25/02; H04L 25/03891; H04L 27/2644; H04L 27/2652; H04L 27/26526; H04L 27/26538;
(Continued)

(56) References Cited

U.S. PATENT DOCUMENTS

| 2007/0071249 A1* | 3/2007 | Reining | ................ H04S 7/305 381/63 |
| 2008/0033730 A1* | 2/2008 | Jot | ..................... H03H 17/0266 704/E21.001 |

(Continued)

FOREIGN PATENT DOCUMENTS

| CN | 110537221 A | 12/2019 |
| TW | 200842827 | 11/2008 |

(Continued)

OTHER PUBLICATIONS

Dillon, H. Hearing aids, Sydney. Australia: Boomerang Press, 2012.
(Continued)

*Primary Examiner* — Lun-See Lao
(74) *Attorney, Agent, or Firm* — Elizabeth Yang

(57) ABSTRACT

An analysis filter bank corresponding to a plurality of sub-bands, comprising: multiple sub-filters with different center frequencies which perform multiple complex-type first-order infinite impulse response filtering operations on an audio input signal to generate multiple sub-filter signals; a first set of binomial combiners, each of which performs a weighted-sum operation on a first number of the sub-filter signals with a first set of binomial weights to generate one of multiple sub-band signals; a second set of binomial combiners, each of which performs a weighted-sum operation on a second number of the sub-filter signals with a second set of binomial weights to generate one of multiple lower sub-band-edge signals or one of multiple higher sub-band-edge signals; and multiple envelope detection with decimation devices, which perform multiple envelope detection with decimation operations on the sub-band signals, the lower sub-band-edge signals, and the higher sub-band-edge signals to generate multiple fine spectrums.

18 Claims, 5 Drawing Sheets

(58) Field of Classification Search
CPC ........... H04L 27/26546; H04L 27/2663; H04L 27/2665; G10L 25/18; G10L 25/51; G10L 19/0204; G10L 15/08; G10L 19/02; G10L 2015/088; H04R 1/245; H04R 1/2838; H04R 1/403; H04R 2430/03; H04R 29/002; H04R 3/02; H04R 3/04; H04R 3/12; H04R 2460/13; H04R 9/066; H04R 1/00; H04R 1/10; H04R 1/1075; H04R 1/2811; H04R 1/2826; H04R 1/2873; H04R 1/2876; H04R 11/02; H04R 17/00; H04R 25/505; H04R 25/606; H04R 3/14; H04R 31/00; H04R 5/033; H04R 9/02; H04R 9/025; H04R 9/063; G10K 11/175; G10K 11/178; G10K 11/26; G10K 2210/3216; G10K 9/13; G10K 9/22; H04N 17/004
USPC ....................... 381/316, 71.11–71.14; 700/94
See application file for complete search history.

(56) References Cited

U.S. PATENT DOCUMENTS

| 2014/0006037 | A1* | 1/2014 | Honma | ................. | G10L 19/24 |
| | | | | | 704/500 |
| 2014/0088978 | A1* | 3/2014 | Mundt | ................. | G10L 19/00 |
| | | | | | 704/500 |
| 2016/0198281 | A1* | 7/2016 | Oh | ................. | H03H 17/0266 |
| | | | | | 381/310 |
| 2020/0260212 | A1* | 8/2020 | Lee | ................. | H04S 7/307 |

FOREIGN PATENT DOCUMENTS

| TW | I590232 | 3/2015 |
| TW | I692754 | 4/2019 |

OTHER PUBLICATIONS

Dorran, David. "Audio time-scale modification." Dublin Institute of Technology Doctoral Thesis (2005).

Laroche, Jean, and Mark Dolson. "New phase-vocoder techniques for pitch-shifting, harmonizing and other exotic effects." Proceedings of the 1999 IEEE Workshop on Applications of Signal Processing to Audio and Acoustics. WASPAA'99 (Cat. No. 99TH8452). IEEE, 1999.

Juillerat, Nicolas, Simon Schubiger-Banz, and Stefan Muller Arisona. "Low latency audio pitch shifting in the time domain." 2008 International Conference on Audio, Language and Image Processing. IEEE, 2008.

Dutoit, Thierry, and Ferran Marques. Applied Signal Processing: A MATLABTM-based proof of concept. Springer Science & Business Media, 2010.

* cited by examiner

ANALYSIS FILTER BANK AND COMPUTING PROCEDURE THEREOF, AUDIO FREQUENCY SHIFTING SYSTEM, AND AUDIO FREQUENCY SHIFTING PROCEDURE

TECHNICAL FILED

The present invention relates to the field of audio signal processing and frequency shifting processing, and particularly relates to an analysis filter bank and computing procedure thereof, an audio frequency shifting system and an audio frequency shifting procedure based on the analysis filter bank and computing procedure thereof.

BACKGROUND

Frequency shifting is a common type of audio processing, which shifts each frequency component of an audio input signal by a specified amount of frequency shifting (hereinafter referred to as shift amount) to implement specific functions/applications, such as the key shifting or the pitch shifting of the speech and music signals, or the frequency lowering of an audio signal or part of the frequency bands thereof to increase the audibility or speech intelligibility. The concept of the frequency shifting can be illustrated by a typical input-output frequency mapping characteristic in FIG. 1 (hereinafter referred to as frequency shifting characteristic and abbreviated as FSC; in FIG. 1, $\frac{1}{2}f_{SAM}$ denotes one half of the sampling rate of the audio input signal $f_{SAM}$, which is the highest frequency of the digitized audio and referred to as Nyquist frequency). If a frequency shifting system shifts each frequency component of the audio input signal by a shift amount in proportion to the center frequency of the frequency component, the system possesses a linear FSC. Conventional speech/music pitch shifting or vocoder operations belong to this category. If a frequency shifting system shifts each frequency component of the audio input signal by a shift amount non-proportionally with the center frequency of the frequency component, the system possesses a non-linear type FSC. Such design is widely applied in hearing aids or hearing assistive devices. Because most hearing-impaired listeners suffer from high-frequency hearing loss, the frequency shifting with a non-linear type FSC may help part of the hearing-impaired listeners perceiving the high-frequency information without changing the pitch of the speech signal. However, due to the destruction on the harmonicity relationship of the sound components, the frequency shifting with a non-linear type FSC is not preferable for music processing. In addition, to support different types of applications, more flexibility on the FSC should be considered, for example, it can be set as a many-to-one mapping characteristic (i.e., a non-monotonic characteristic suitable for a listener with a narrow audible frequency range), one-to-many mapping characteristic (i.e., shifting multiple replicas of a frequency component to different frequencies), or can be even dynamically changed depending on the type of the audio input, these belongs to the design variants with modified FSCs.

To date, there are a variety of well-known frequency shifting algorithms that support the aforementioned FSCs, such as: performing frequency transposition in a frequency range on a time-domain audio waveform (refer to Reference 1), adjusting an audio waveform by performing the synchronized overlap-add (SOLA) method or its variants followed with a resampling operation (refer to Reference 2), transforming an audio waveform to spectrums and performing the phase vocoder algorithm or its variants (refer to Reference 3), and performing frequency-division filtering (i.e., performing multiple filter processing different in center frequency to separate the audio components of different frequencies) on an audio waveform for the Rollers frequency shifting algorithm (refer to Reference 4) and so on. These algorithms are different in multiple aspects. They are suitable for different signal processing architectures (e.g. time-domain processing or frequency-domain processing). Each of them introduces different types of artifacts. Each of them faces different restrictions, such as the applicability of on-line and off-line applications, the applicability of processing monophonic and polyphonic audio, the FSC type support (e.g. linear FSC, non-linear type FSCs, etc.). Moreover, they are with large variation in computational complexity. To provide an audio output with high quality, natural sounding, minimized artifacts, and very low processing delay in a real-time audio processing system, the Rollers frequency shifting algorithm best fits these requirements. The implementation of the Rollers frequency-shifting algorithm is based on a filter bank design. In short, the filter bank is composed of multiple paralleled filters respectively corresponding to multiple frequency bands called sub-bands. Therefore, the paralleled filters are referred to as sub-band filters, and the output signal of each sub-band filter is referred to as a sub-band signal.

The Rollers frequency shifting algorithm can be illustrated by the block diagram of FIG. 2. A Rollers frequency shifting system 200 comprises a large infinite impulse response (hereinafter abbreviated as IIR) filter bank 201, multiple paralleled real-to-complex converters and frequency shifters 202, and a summation device 203. The filter bank 201 includes a large number of sub-band filters (the number of filters suggested in the literature is about hundreds to thousands), and each sub-band filter is implemented by a fourth-order Butterworth filter to reduce the computational complexity of the frequency-division filtering. The IIR filter bank 201 passes a real-type audio input signal through the sub-band filters to generate multiple real-type sub-band signals respectively (*1). The real-to-complex converters and the frequency shifters 202 pass the real-type sub-band signals through single-side-band modulation (which is an approximate function of the Hilbert transform) so as to convert the sub-band signals to complex type signals. After that, the frequency shifting operation of each complex-type sub-band signal is performed according to the specified shift amount (determined by substituting the center frequency of the corresponding sub-band into the FSC) to obtain one of a plurality of shifted sub-band signals. Finally, the summation device 203 combines the shifted sub-band signals into an audio output signal. Since the audio output signal is of real type, the summation is performed only on the real part values of the shifted sub-band signals. The Rollers frequency shifting system 200 based on the filter bank is suitable for sample-based signal processing, and the processing delay of the system is mainly contributed by the group delay of each sub-band filter of the filter bank. It is usually significantly lower than the processing delay of the frequency-domain signal processing (*2), hence it is suitable for the system design with low processing delay requirement. In addition, the main body of this architecture includes a large number of paralleled IIR filtering, single-side band conversion, and frequency shifting operations. These operations are highly parallelized (i.e., operations of the respective sub-bands have no dependency on each other), which are suitable for hardware implementation or execution on a multi-processor platform.

(*1): If the sub-band filters of a filter bank share the same input signal, the filter bank is referred to as an analysis filter bank. The IIR filter bank 201 is an analysis filter bank.

(*2): Frequency-domain signal processing is a frame-based processing. Because it is accompanied by a time-to-frequency transform and its inverse transform, the algorithmic delay of the signal processing (a processing delay under zero arithmetic computation delay assumption, which is the theoretical minimum processing delay) is basically not less than one frame interval. However, the frame length has to be set long enough to make the frequency resolution of the spectrum meet the requirements of subsequent signal processing operations. Therefore, the frequency resolution and delay requirements are a dilemma in real-time audio processing systems.

Though with good output sound quality, low processing delay, simple and highly parallelized architecture, the feasibility of implementing the Rollers frequency shifting architecture on low-power mobile devices, wearable devices, and the real-time software platforms is still limited due to the large number of the high-order filtering and the single sideband conversion operations (according to the literature, it is more suitable to implement on a personal computer). Therefore, seeking a filter bank design suitable for supporting the frequency shifting operation while with low computational complexity is the key of implementing the time-domain frequency shifting algorithms for real-time applications on low-power wearable devices, mobile devices, or even on software platforms.

REFERENCES DOCUMENTS

Reference 1: Dillon, H. Hearing aids, Sydney. Australia: Boomerang Press, 2012.

Reference 2: Dorran, David. "Audio time-scale modification." Dublin Institute of Technology Doctoral Thesis (2005).

Reference 3: Laroche, Jean, and Mark Dolson. "New phase-vocoder techniques for pitch-shifting, harmonizing and other exotic effects." Proceedings of the 1999 IEEE Workshop on Applications of Signal Processing to Audio and Acoustics. WASPAA'99 (Cat. No. 99TH8452). IEEE, 1999.

Reference 4: Juillerat, Nicolas, Simon Schubiger-Banz, and Stefan Muller Arisona. "Low latency audio pitch shifting in the time domain." 2008 International Conference on Audio, Language and Image Processing. IEEE, 2008.

Reference 5: Dutoit, Thierry, and Ferran Marques. Applied Signal Processing: A MATLAB™-based proof of concept. Springer Science & Business Media, 2010.

SUMMARY

In view of the aforementioned key issues in these frequency shifting systems, the purpose of the present invention is to provide two audio frequency shifting systems and corresponding two audio frequency shifting procedures for real-time applications, and an analysis filter bank and a filter bank computing procedure applied in the audio frequency shifting systems and the audio frequency shifting procedures respectively. The audio frequency shifting systems and the corresponding audio frequency shifting procedures employ the analysis filter bank and the filter bank computing procedures respectively to generate fine spectrums used for dynamically estimating the corresponding shift amount of each sub-band signal. It reduces the overall computational complexity of the audio frequency shifting systems while maintains the audio quality, hence it is suitable for a real-time audio processing software implementation and a low-power audio device implementation.

A first aspect of the present invention provides an analysis filter bank corresponding to a plurality of sub-bands, comprising:

a plurality of sub-filters with different center frequencies which perform a plurality of complex-type first-order IIR filtering operations on an input signal to generate a plurality of sub-filter signals;

a first set of binomial combiners, each of which performs a weighted-sum operation on a first number of the sub-filter signals with a first set of binomial weights to generate one of a plurality of sub-band signals, wherein the first number of the sub-filter signals are generated by the first number of the sub-filters adjacent in center frequency;

a second set of binomial combiners, each of which performs a weighted-sum operation on a second number of the sub-filter signals with a second set of binomial weights to generate one of a plurality of lower sub-band-edge signals or one of a plurality of higher sub-band-edge signals, wherein the second number of the sub-filter signals are generated by the second number of the sub-filters adjacent in center frequency; and a plurality of envelope detection with decimation devices which perform a plurality of envelope detection with decimation operations on the sub-band signals, the lower sub-band-edge signals, and the higher sub-band-edge signals to generate a plurality of fine spectrums.

A second aspect of the present invention provides an audio frequency shifting system, comprising:

an analysis filter bank according to the first aspect, which performs frequency-division filtering and envelope detection on an input signal to generate a plurality of sub-band signals and a plurality of fine input spectrums;

a frequency shifting controller, which estimates a plurality of sub-band signal frequencies respectively corresponding to the sub-band signals according to each of the fine input spectrums, and determines a plurality of frequency shifting parameter sets (hereinafter abbreviated as FSPSs) respectively corresponding to a plurality of shifted sub-band signals according to the sub-band signal frequencies;

a plurality of frequency shifting and weighting devices, each of which corresponding to one of the FSPSs performs a frequency shifting operation on one of the sub-band signals corresponding to a sub-band number of the FSPS by a shift amount of the FSPS, and weights a result of the frequency shifting operation by a shifted sub-band weight of the FSPS to generate one of the shifted sub-band signals; and a sub-band combiner, which performs a sub-band combining operation on the shifted sub-band signals to generate an output signal.

A third aspect of the present invention provides an audio frequency shifting system, comprising:

a framing and time-to-frequency transform device, which divides an input signal into a plurality of audio frames with equal frame length and equal frame spacing, and performs a time-to-frequency transform on each of the audio frames to generate a plurality of band signals;

a plurality of analysis filter banks according to the first aspect, wherein the analysis filter banks respectively perform frequency-division filtering and envelope detection on the band signals to generate a plurality of sub-band signals and a plurality of band spectrums, and the band spectrums at a frame period are lumped as a fine input spectrum;

a frequency shifting controller, which estimates a plurality of sub-band signal frequencies respectively corresponding to the sub-band signals according to the fine input spectrum, and determines a plurality of FSPSs corresponding to a plurality of shifted sub-band signals according to the sub-band signal frequencies;

a plurality of frequency shifting and weighting devices, each of which corresponding to one of the FSPSs performs a frequency shifting operation on one of the sub-band signals corresponding to a sub-band number of the FSPS by a frequency shift amount of the FSPS, and weights a result of the frequency shifting operation by a shifted sub-band weight of the FSPS to generate one of the shifted sub-band signals;

a plurality of sub-band combiners, each of which performs a sub-band combining operation on a subset of the shifted sub-band signals corresponding to a shifted band number to generate one of a plurality of modified band signals; and a frequency-to-time transform device, which performs a frequency-to-time transform on a plurality of instantaneous samples of the modified band signals at each frame period to generate an output signal.

A fourth aspect of the present invention provides a filter bank computing procedure corresponding to a plurality of sub-bands, comprising the following steps:

performing a plurality of complex-type first-order IIR filtering operations with different center frequencies on an input signal to obtain a plurality of sub-filtered signals;

selecting a plurality of first subsets of the sub-filtered signals, wherein each of the first subsets corresponding to one of the sub-bands contains a first number of the sub-filtered signals obtained from the first number of the filtering operations adjacent in center frequency, and for each of the first subsets, performing a weighted-sum operation on a plurality of instantaneous values of the first number of the sub-filtered signals in the subset at each sample period with a first set of binomial weights to obtain one of a plurality of sub-band signals;

selecting a plurality of second subsets of the sub-filtered signals, wherein each of the second subsets corresponding to a lower-frequency side or a higher-frequency side of one of the sub-bands contains a second number of the sub-filtered signals obtained by the second number of the filtering operations adjacent in center frequency, and for each of the second subsets, performing a weighted-sum operation on a plurality of instantaneous values of the second number of the sub-filtered signals in the subset at each sample period with a second set of binomial weights to obtain one of a plurality of lower sub-band-edge signals or one of a plurality of higher sub-band-edge signals; and performing a plurality of envelope detection with decimation operations on the sub-band signals, the lower sub-band-edge signals, and the higher sub-band-edge signals to obtain at least one fine spectrum.

A fifth aspect of the present invention provides an audio frequency shifting procedure, comprising the following steps:

executing a filter bank computing procedure according to the fourth aspect on an input signal to obtain a plurality of sub-band signals and at least one fine input spectrum;

estimating a plurality of sub-band signal frequencies respectively corresponding to the sub-band signals according to each of the at least one fine input spectrum, and determine a plurality of FSPSs corresponding to a plurality of shifted sub-band signals according to the sub-band signal frequencies;

for each of the FSPSs, performing a frequency shifting operation on one of the sub-band signals corresponding to a sub-band number of the FSPS by a shift amount of the FSPS, and multiplying a result of the frequency shifting operation by a shifted sub-band weight of the FSPS to obtain one of the shifted sub-band signals; and performing a sub-band combining operation on the shifted sub-band signals to obtain an output signal.

The sixth aspect of the present invention provides an audio frequency shifting procedure, comprising the following steps:

performing a time-to-frequency transform operation on at least one frame of an input signal to obtain a plurality of band signals;

executing a plurality of filter bank computing procedures according to the fourth aspect on the band signals to obtain a plurality of sub-band signals and a plurality of band spectrums, and lumping the band spectrums at each frame period as a fine input spectrum;

estimating a plurality of sub-band signal frequencies respectively corresponding to the sub-band signals according to the fine input spectrum, and determining a plurality of FSPSs respectively corresponding to a plurality of shifted sub-band signals according to the sub-band signal frequencies;

for each of the FSPSs, performing a frequency shifting operation on one of the sub-band signals corresponding to a sub-band number of the FSPS by a shift amount of the FSPS, and multiplying a result of the frequency shifting operation by a shifted sub-band weight of the FSPS to obtain one of the shifted sub-band signals;

for each of a plurality of shifted band numbers appearing in the FSPSs, performing a sub-band combining operation on a subset of the shifted sub-band signals corresponding to the shifted band number to obtain one of a plurality of modified band signals; and performing a frequency-to-time transform operation on a plurality of instantaneous samples of the modified band signals at each frame period to obtain an output signal.

DETAILED DESCRIPTION

To make the present invention better understood by those skilled in the art to which the present invention pertains, preferred embodiments of the present invention are detailed below with the accompanying drawings to clarify the content of the present invention and effects to be achieved thereof.

Figure 1:
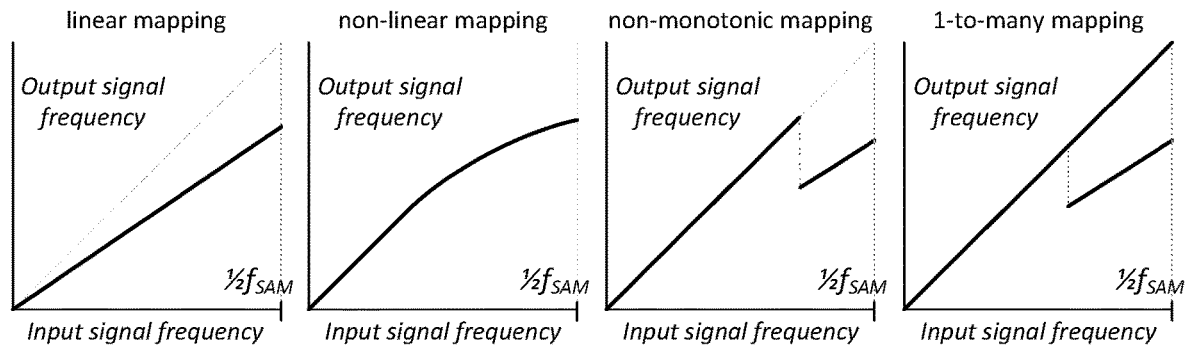
FIG. 1 is a plot of a static input-output frequency mapping characteristic.
Figure 2:
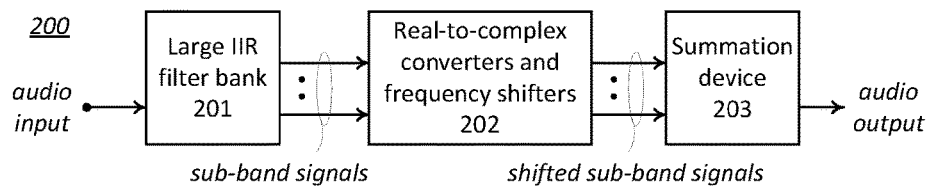
FIG. 2 is a block diagram of a Rollers frequency shifting system based on a filter bank.
Figure 3:
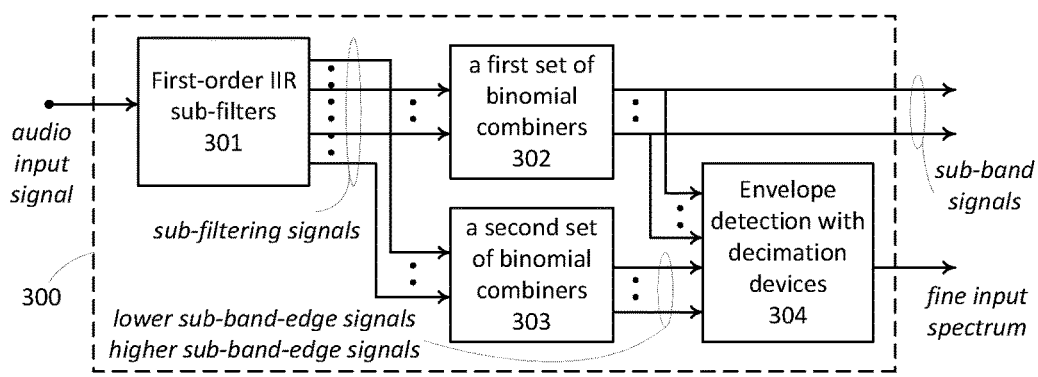
FIG. 3 is a block diagram of an analysis filter bank of the present invention.

FIG. 3 is a block diagram of an analysis filter bank of the present invention. The four embodiments of the present invention all comprise the analysis filter bank or its functionally equivalent computing procedure. The analysis filter bank 300 corresponds to S sub-bands numbered from low to high according to the sub-band center frequencies. The analysis filter bank 300 comprises multiple paralleled first-order IIR sub-filters 301, a first set of paralleled combiners based on a set of $M^{th}$-order binomial weights (hereinafter referred to as $M^{th}$-order binomial combiners; M≥1) 302, a second set of paralleled combiners based on a set of $\hat{M}^{th}$-order binomial weights (hereinafter referred to as $\hat{M}^{th}$-order binomial combiners; $\hat{M}$≥1) 303, and multiple paralleled envelope detection with decimation devices 304. The first set of $M^{th}$-order binomial combiners 302 combine the output signals of the first-order IIR sub-filters 301 (hereinafter referred to as sub-filter signals) to generate multiple sub-band signals. Considering that the sub-band signals can be obtained by passing an audio input signal of the analysis filter bank through multiple independent filters respectively corresponding to the sub-bands, such independent filters are hereinafter referred to as equivalent sub-band filters.

The paralleled first-order IIR sub-filters 301 are with different center frequencies and are numbered according to their center frequencies from low to high. Each IIR sub-filter performs a complex-type first-order IIR filtering operation on an audio input signal to generate one of a plurality of sub-filter signals. The IIR filtering operation can be expressed as:

$$y_{IIR,k}[n] = b_k \cdot x[n] - \alpha_k \cdot y_{IIR,k}[n-1], \quad (1)$$

wherein k denotes the No. of the IIR sub-filter, n denotes the sampling time index, x denotes the audio input signal, and $y_{IIR,k}$ denotes the No. k sub-filter signal, $a_k$ and $b_k$ denote a complex-type feedback coefficient and a real-type feedforward coefficient of the No. k IIR sub-filter respectively, expressed as:

$$a_k = \left(1 - \frac{BW_{IIR,k}}{f_{SAM}}\right) \cdot \exp\left[j\left(2\pi \cdot \frac{f_{IIR,k}}{f_{SAM}}\right)\right], \quad (2)$$

$$b_k = \rho \cdot \left(\frac{BW_{IIR,k}}{f_{SAM}}\right)^{\mu}, \quad (3)$$

wherein $f_{IIR,k}$ and $BW_{IIR,k}$ denote the center frequency and the bandwidth (*) of the No. k IIR sub-filter respectively, $f_{SAM}$ denotes the sampling rate of the audio input signal of the analysis filter bank 300, μ and ρ denote the two parameters of the IIR sub-filters 301. Changing μ may alter the averaged passband level of the IIR sub-filter response, and changing ρ may alter the variation of the passband levels of the IIR sub-filter responses over sub-bands. The goal of adjusting μ and ρ is to make the passband gain response of each sub-band close to 0 dB.

*: The bandwidth of each of the IIR sub-filters 301 is determined by the width of at least one corresponding sub-band. For example, in a filter bank design with equal-width sub-bands, the bandwidths of the IIR sub-filters 301 are identical. In a design where the sub-band width increases with the sub-band center frequency, the bandwidth of each of the IIR sub-filters 301 increases with the sub-filter center frequency.

Each of the first set of $M^{th}$-order (M≥1) binomial combiners 302 performs a weighted-sum operation on M+1 of the sub-filtered signals with a set of $M^{th}$-order binomial weights to generate one of the sub-band signals, wherein the M+1 of the sub-filter signals are generated by the M+1 of the IIR sub-filters 301 adjacent in center frequency (i.e., consecutively numbered). The $m^{th}$ weight of the set of $M^{th}$-order binomial weights is the $m^{th}$ coefficient of the polynomial expansion of $(1-x)^M$:

$$B_{M,m} = (-1)^m \cdot \frac{M!}{m!(M-m)!}, \quad (4)$$

and the weighted-sum operation of the first set of $M^{th}$-order binomial combiners 302 can be expressed as:

$$y_{FB,s}[n] = \sum_{m=0}^{M} B_{M,m} \cdot y_{IIR,k_s+m}[n], \quad \forall s \in [1, S] \quad (5)$$

where s denotes the No. of the combiner (equal to the No. of the corresponding sub-band), $y_{FB,s}$ denotes the No. s sub-band signal of the analysis filter bank 300, and $k_s$ denotes the lowest No. of the sub-filter signals used by the No. s combiner of the first set of $M^{th}$-order binomial combiners 302, $y_{IIR,k_s+m}$ denotes the No. $k_s$+m sub-filter signal, and the remaining notations are as aforementioned. Considering that two sub-band signals respectively corresponding to any two of the sub-bands adjacent in frequency share P sub-filter signals (i.e., two of the first set of $M^{th}$-order binomial combiners 302 with any two consecutive No. share P sub-filters signal, where P∈ [0, M]), then $k_s$ can be expressed as:

$$k_s = (M-P+1) \cdot (s-1) + 1. \quad (6)$$

Therefore, the first set of $M^{th}$-order binomial combiners 302 corresponds to (M−P+1)·S+P IIR sub-filters in total.

The reason of employing higher-order binomial combiners is to increase the stopband attenuation level and the transition-band attenuation slopes of the frequency responses of the equivalent sub-band filters. The stopband attenuation levels of the filter responses of the first-order IIR sub-filters are about 20 to 30 dB. Through the weighted-sum operations with the $M^{th}$-order binomial weights, the stopband attenuation levels and the transition-band attenuation slopes of the frequency response of the equivalent sub-band filter corresponding to each sub-band can be increased by multiples. While the drawback is that the group delays of the equivalent sub-band filter are also increased by multiples. Hence the applicability of employing higher-order binomial combiners has to be considered in conjunction with the system applications.

Each of the second set of $\hat{M}^{th}$-order ($\hat{M} \geq 1$) binomial combiners 303 performs a weighted-sum operation on $\hat{M}+1$ of the sub-filtered signals by a set of $\hat{M}^{th}$-order binomial weights to generate one of the lower sub-band-edge signals or one of the higher sub-band-edge signals, wherein the $\hat{M}+1$ of the sub-filter signals are generated by the $\hat{M}+1$ of the IIR sub-filters 301 adjacent in center frequency (i.e., consecutive numbers). This set of $\hat{M}^{th}$-order binomial weights can be generated by substituting $\hat{M}$ into M of equation (4). The operations of the second set of $\hat{M}^{th}$-order binomial combiners 303 can be expressed as:

$$\begin{cases} y_{LE,s}[n] = \sum_{m=0}^{\hat{M}} B_{\hat{M},m} \cdot y_{IIR,k_s-\delta_{LE}+m}[n] \\ y_{UE,s}[n] = \sum_{m=0}^{\hat{M}} B_{\hat{M},m} \cdot y_{IIR,k_s+\delta_{UE}+m}[n] \end{cases}, \forall s \in [1, S] \quad (7)$$

wherein $y_{LE,s}$ denotes the lower sub-band-edge signal corresponding to No. s sub-band, $y_{UE,s}$ denotes the higher sub-band-edge signal corresponding to No. s sub-band, and $\delta_{LE,s}$ and $\delta_{UE,s}$ denote a negative index offset and a positive index offset for deriving $y_{LE,s}$ and $y_{UE,s}$ respectively, $y_{IIR,k_s-\delta_{LE}+m}$ denotes the No. $k_s-\delta_{LE}+m$ sub-filter signal, $y_{IIR,k_s+\delta_{UE}+m}$ denotes the No. $k_s+\delta_{UE}+m$ sub-filter signal, $B_{\hat{M},m}$ denotes the $m^{th}$ weight of the set of $\hat{M}^{th}$-order binomial weights, and the remaining notations are as aforementioned.

In addition, the settings of the two index offsets $\delta_{LE}$, $\delta_{UE}$ satisfy:

$$\begin{cases} \delta_{LE} \in [0, M-P+1] \\ \delta_{UE} = \delta_{LE} + M - \hat{M} \end{cases}, \quad (8)$$

where the notations are as aforementioned. Under the restriction of (8), the weighted-sum operations of $y_{LE,s}$ and $y_{FB,s}$ share at least one of the sub-filter signals, and the combining operations of $y_{UE,s}$ and $y_{FB,s}$ also share at least one of the sub-filter signals. The center frequency of the No. s higher sub-band-edge signal is located between the center frequency of the No. s sub-band and the center frequency of the No. s+1 sub-band (such a frequency range is also referred to as a higher-frequency side of the No. s sub-band), and the center frequency of the No. s lower sub-band-edge signal is located between the center frequency of the No. s sub-band and the center frequency of the No. s−1 sub-band (such a frequency range is also referred to as a lower-frequency side of the No. s sub-band). Therefore, the second set of $\hat{M}^{th}$-order binomial combiners 303 corresponds to $(M-P+1) \cdot S + P + 2 \cdot \delta_{LE}$ IIR sub-filters in total.

Normally, the number of combiners of the second set of $\hat{M}^{th}$-order binomial combiners 303 (generating the lower sub-band-edge signals and the higher sub-band-edge signals) is twice the number of combiners of the first set of $M^{th}$-order binomial combiners 302 (generating the sub-band signals). While the number of combiners can be further reduced if the settings of $\hat{M}$ and $\delta_{LE}$ satisfy the following relationship:

$$\begin{cases} \hat{M} \in [P+1, 2M-P+1] \\ \delta_{LE} = (\hat{M}+1-P)/2 \end{cases}. \quad (9)$$

According to (7)~(9), we have $y_{UE,s}[n] = y_{LE,s+1}[n]\ \forall n$, i.e., the No. s higher sub-band-edge signal and the No. s+1 lower sub-band-edge signal are identical. The constraint of (9) reduces the number of combiners of the second set of $\hat{M}^{th}$-order binomial combiners 303 to S+2. Therefore, the extra computations of the analysis filter bank 300 to support the frequency shifting can be reduced.

The envelope detection with decimation devices 304 performs multiple envelope detection with decimation operations on the sub-band signals, the lower sub-band-edge signals, and the higher sub-band-edge signals to generate multiple fine spectrums (a decimation operation is just an integer down-sampling, where the down-sampling ratio, also referred to as decimating factor, is a ratio of the sampling rate of the audio input signal over the frame rate of the fine spectrum). Generally speaking, the envelope of a signal can be generated by detecting the amplitude, power, power level or related information of the signal and smoothing the detection result in the time domain and/or the frequency domain. Taking the detection of the amplitude envelope as an example, the envelope detection with decimation devices 304 passes the amplitude values of the sub-band signals, the amplitude values of the lower sub-band-edge signals, and the amplitude values of the higher sub-band-edge signals to a leaky integration stage to generate multiple amplitude envelopes, and decimates the amplitude envelopes by a decimating factor of greater than one to form the fine spectrums with a lower frame rate (the sampling period of the decimated envelopes, which is the reciprocal of the frame rate, is referred to as the decimation period). The envelope detection operations can be expressed as:

$$\begin{cases} u_{L,s}[n] = (1-\alpha) \cdot u_{L,s}[n-1] + \alpha \cdot |y_{LE,s}[n]| \\ u_{C,s}[n] = (1-\alpha) \cdot u_{C,s}[n-1] + \alpha \cdot |y_{FB,s}[n]| \\ u_{U,s}[n] = (1-\alpha) \cdot u_{U,s}[n-1] + \alpha \cdot |y_{UE,s}[n]| \end{cases}, \forall s \in [1, S] \quad (10)$$

wherein $u_{L,s}$, $u_{U,s}$, $u_{C,s}$ denote the amplitude envelope of the No. s lower sub-band-edge signal, the amplitude envelope of the No. s higher sub-band-edge signal, and the amplitude envelope of the No. s sub-band signal respectively, $\alpha$ denotes the leaky factor of the leaky integration, and the remaining notations are as aforementioned. To ensure that the reduction of the frame rate of the fine spectrum through decimation does not affect the audio quality of the subsequent frequency shifting result, the frame rate of the fine spectrum should not be less than twice the bandwidth of the widest sub-band (to fulfill the sampling theorem). Each of the fine spectrums includes a plurality of instantaneous values of the amplitude envelopes of the sub-band signals, the amplitude envelopes of the lower sub-band-edge signals, and the amplitude envelopes of the higher sub-band-edge signals at a decimation period. Such fine spectrum information with frequency resolution higher than that of the sub-band signals facilitates the frequency shifting controller 501 determining the corresponding shift amount of each sub-band.

Figure 4:
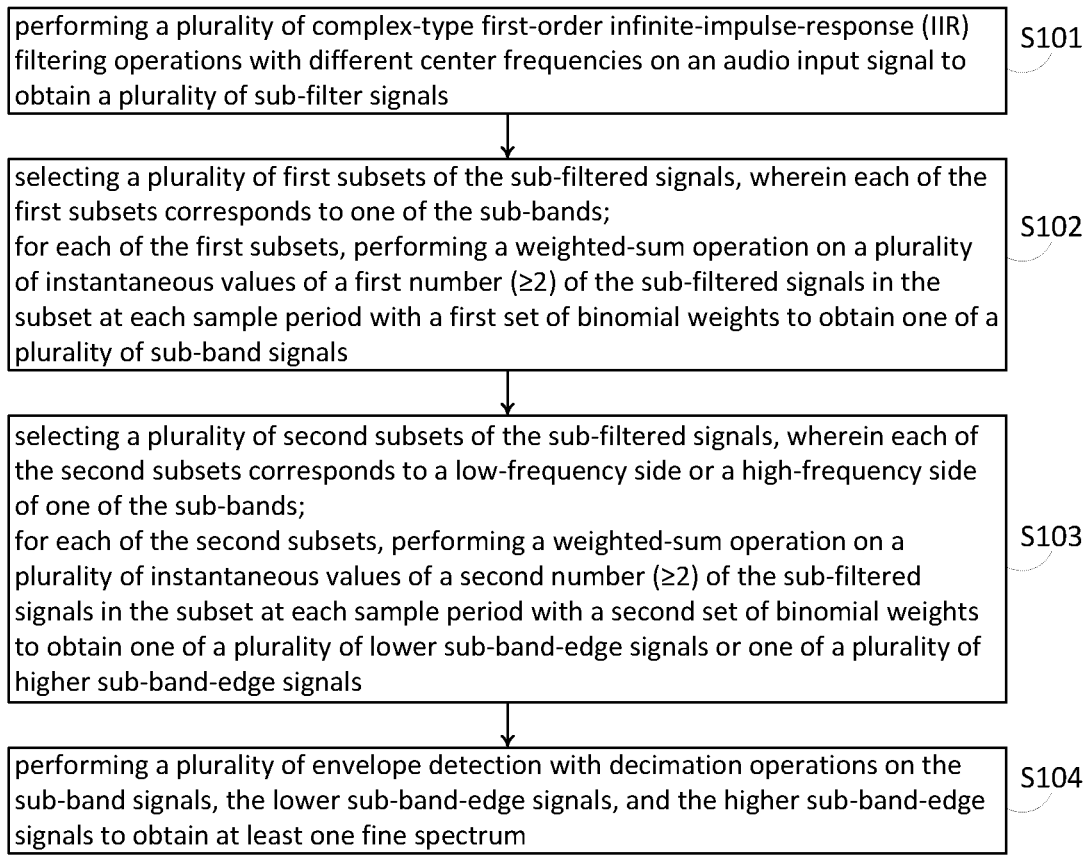
FIG. 4 is a flow chart of a filter bank computing procedure of the present invention.

In addition to being implemented by a physical device, the function of the analysis filter bank 300 can also be implemented by an equivalent computing procedure executed on at least one processor. FIG. 4 is the flowchart of a filter-bank computing procedure of the present invention. The filter-bank computing procedure corresponds to multiple sub-bands. In describing the steps of the filter-bank computing procedure, equations (1) to (10) and the corresponding paragraphs are referred. The flow steps focus on the processing method of a segment of a continuous audio signal, because the signal is segmentally processed for each step to support a real-time audio application, i.e., each step processes an output signal segment just obtained by the previous step instead of waiting the entire output signal obtained by the previous step.

In FIG. 4, a plurality of complex-type first-order IIR filtering operations with different center frequencies are performed on at least one sample of an audio input signal to obtain a plurality of sub-filtered signals respectively (step S101). Referring to paragraph [0015], the complex-type first-order IIR filtering operations corresponds to the calculation of equation (1) to (3). Each sub-filtered signal includes at least one sample.

A plurality of first subsets of the sub-filtered signals are selected, wherein each of the first subsets corresponding to one of the sub-bands contains a first number (≥2) of the sub-filtered signals obtained by the first number of the filtering operations adjacent in center frequency. For each of the first subsets, a weighted-sum operation is performed on a plurality of instantaneous values of the first number of the sub-filtered signals in the subset at each sample period with a first set of binomial weights to obtain one of a plurality of sub-band signals (step S102). Referring to paragraphs [0016] and [0017], the weighted-sum operation based on the first set of binomial weights corresponds to the calculation of equation (5). Each sub-band signal includes at least one sample.

A plurality of second subsets of the sub-filtered signals are selected, wherein each of the second subsets corresponding to a lower-frequency side or a higher-frequency side of one of the sub-bands contains a second number (≥2) of the sub-filtered signals obtained by the second number of the filtering operations adjacent in center frequency. For each of the second subsets, a weighted-sum operation is performed on a plurality of instantaneous values of the second number of the sub-filtered signals in the subset at each sample period with a second set of binomial weights to obtain one of a plurality of lower sub-band-edge signals or one of a plurality of higher sub-band-edge signals (step S103). Referring to paragraphs [0018] to [0020], the weighted-sum operation based on the second set of binomial weights corresponds to equation (7). Each of the lower sub-band-edge signals and the higher sub-band-edge signals includes at least one sample A plurality of envelope detection with decimation operations are performed on the sub-band signals, the lower sub-band-edge signals, and the higher sub-band-edge signals to obtain at least one fine spectrum (step S104), wherein each fine spectrum includes a plurality of instantaneous values of the envelopes of the sub-band signals, the envelopes of the lower sub-band-edge signals, and the envelopes of the higher sub-band-edge signals at a decimation period. Refer to equation (10) and paragraph [0021] for more detail of the envelope detection with decimation operations.

Figure 5:
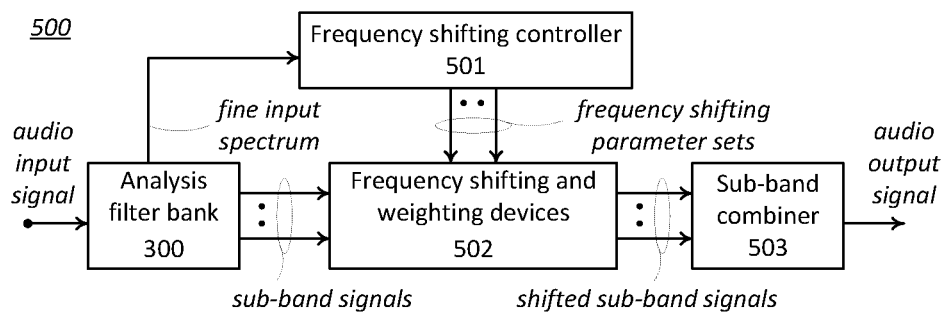
FIG. 5 is a block diagram of an audio frequency shifting system of a first embodiment of the present invention.

FIG. 5 is a block diagram of an audio frequency shifting system of the first embodiment of the present invention. The audio frequency shifting system 500 comprises an analysis filter bank 300, a frequency shifting controller 501, a plurality of frequency shifting and weighting devices 502, and a sub-band combiner 503.

The analysis filter bank 300 performs frequency-division filtering and envelope detection on an audio input signal according to a plurality of sub-bands to generate multiple sub-band signals and multiple fine input spectrums. The audio input signal is a digitized waveform, which may come from the output of an analog-to-digital converter, from an audio storage device, or further down sampling the signal (while the sound over the listener's audible frequency range is preserved) before being inputted to the audio frequency shifting system 500. Down sampling saves unnecessary computations on processing the high-frequency sound inaudible by the listener. In addition, it may prevent the high-frequency sound from occupying the limited dynamic range of numerical operations.

The frequency shifting controller 501 determines multiple frequency shift amounts and multiple shifted sub-band weights of the sub-band signals according to each of the fine input spectrums. More specifically, the frequency shifting controller 501 estimates a plurality of sub-band signal frequencies respectively corresponding to the sub-band signals according to each of the fine input spectrums, which can be expressed as:

$$\tilde{f}_{SB,s}[h] = f_{SB,s} + C_{CFO,s} \cdot \frac{u_{U,s}[h] - u_{L,s}[h]}{u_{U,s}[h] + u_{C,s}[h] + u_{L,s}[h]}, \forall s \in [1, S] \quad (11)$$

wherein h denotes the time index of the fine input spectrum, $\tilde{f}_{SB,s}$ denotes the No. s sub-band signal frequency (i.e., center frequency of the No. s sub-band signal), $f_{SB,s}$ denotes the center frequency of the No. s sub-band, $C_{CFO,s}$ denotes the scaling factor of the No. s sub-band, and the remaining notations are as aforementioned. To avoid excessive frequency estimation error, $\tilde{f}_{SB,s}$ can be further limited between the lowest and highest center frequencies of the IIR sub-filters corresponding to the No. s sub-band, i.e., $\tilde{f}_{SB,s} \in [f_{IIR,k_s}, f_{IIR,k_s+M}]$. Moreover, the $C_{CFO,s}$ settings are aimed to make the two sub-band signal frequencies of equation (11) corresponding to any two adjacent sub-bands roughly equal as a single-frequency input falls at the boundary of the two adjacent sub-bands (i.e., if the audio input signal is a single tone with a frequency at the boundary of the No. s and No. s+1 sub-bands, by calculating (11) we have $\tilde{f}_{SB,s}[h] \approx \tilde{f}_{SB,s+1}[h] \forall h$). Such $C_{CFO,s}$ setting is roughly proportional to the width of the No. s sub-band. In case the analysis filter bank 300 is with equal-width sub-bands, the settings of $C_{CFO,s}$ for all sub-bands are equal.

In addition to equation (11), alternative ways to estimate the frequency of the spectrum components do exist. For instance, in Reference 3 an approach based on the second-order polynomial fitting (also known as polynomial regression) is proposed, which takes three consecutive samples around a local peak on an audio spectrum to estimate the center frequency of each partial. The partial is a narrow-band component of the audio signal, which corresponds to a spectral region including the local peak on the audio spectrum.

After estimating the sub-band signal frequencies, the frequency shifting controller 501 substitutes each sub-band signal frequency into a FSC which allows one-to-many mapping. Specifically, each sub-band signal is designated to be mapped to at least one shifted sub-band signal, where each shifted sub-band signal is characterized by a shift amount (the difference between the center frequencies of the shifted sub-band signal and the corresponding sub-band signal) and a shifted sub-band weight (the ratio of the shifted sub-band signal strength over the corresponding sub-band signal strength). After subsequent frequency shifting operations, a total of $\hat{S}$ shifted sub-band signals are generated from S sub-band signals ($\hat{S} \geq S$), where the No. s sub-band signal is frequency shifted to generate the No. $\hat{S}_{s-1}+1$ to $\hat{S}_s$ shifted sub-band signals ($\hat{S}_0=0$, $\hat{S}_s \geq \hat{S}_{s-1}+1$, and $\hat{S}_s=\hat{S}$). In a nutshell, the frequency shifting controller 501 determines $\hat{S}$ FSPSs respectively corresponding to the $\hat{S}$ shifted sub-band signals according to the S sub-band signal frequencies, where each of the FSPSs includes a sub-band number, a shift amount, and a shifted sub-band weight.

In practice, the shift amount of a FSC is zero in part of the sub-bands (it is common for non-linear type FSCs). In this case, there is no need to estimate the corresponding sub-band signal frequencies, nor to calculate the corresponding lower sub-band-edge signal, higher sub-band-edge signal, and their envelopes.

Each of the frequency shifting and weighting devices 502 corresponding to one of the FSPSs performs a frequency shifting operation on one of the sub-band signals corresponding to a sub-band number of the FSPS by a shift amount of the FSPS, and weights a result of the frequency shifting operation by a shifted sub-band weight of the FSPS to generate one of the shifted sub-band signals. The frequency shifting operation and the weighting operation can be expressed as:

$$y_{SHF,v}[n] = \text{real}\left\{y_{FB,s}[n] \cdot w_v[n] \cdot \exp\left[j \cdot \left(\theta_v + \frac{2\pi}{f_{SAM}} \sum_{t=0}^{n} f_{SHF,v}[t]\right)\right]\right\}, \quad (12)$$

$$\forall v \in \left[\hat{S}_{s-1} + 1, \hat{S}_s\right], s \in [1, S]$$

wherein $y_{SHF,v}$ denotes the No. v shifted sub-band signal, which is obtained by performing aforementioned frequency shifting and weighting operation on the No. s sub-band signal $y_{FB,s}$, real($\cdot$) denotes a function of taking the real part value of a complex value, $w_v$ denotes the shifted sub-band weight of the No. v shifted sub-band signal, $f_{SHF,v}$ denotes the shift amount of the No. v shifted sub-band signal, $f_{SAM}$ denotes the sampling rate of the audio input signal, $\theta_v$ denotes an initial phase of the No. v shifted sub-band signal, and the remaining notations are as aforementioned. To simplify the representation, the time indices of the frequency shift parameters such as $w_v$ and $f_{SHF,v}$ are set the same as the time index of the shifted sub-band signals. Actually, the FSPSs are generated at a rate equal to or lower than the frame rate of the fine input spectrum. When computing the values of the shifted sub-band signals at each sample period, the latest FSPSs corresponding to the sample period are adopted. Moreover, since the output of the audio frequency shifting system 500 is of real type, only the real part values of the shifted sub-band signals are required for subsequent combining operations.

For each shifted sub-band signal with zero shift amount, the setting of $\theta_v$ in equation (11) affects the frequency response of the output signal of the system. The present invention suggests to determine $\theta_v$ according to the center frequency of the No. s sub-band corresponding to the No. v shifted sub-band signal regardless of the shift amount $f_{SHF,v}$. For example, in the embodiment of the present invention, the sub-bands are numbered from low to high according to the sub-band center frequencies, hence $\theta_v$ is set to a value proportional to s where s is the sub-band number corresponding to the No. v shifted sub-band signal (in the following examples, $\theta_v$ is set to $-s\cdot\pi/2$).

The sub-band combiner 503 performs a sub-band combining operation on the shifted sub-band signals to generate an audio output signal, where the sub-band combining operation is based on the configuration of the frequency shift sub-bands. Specifically, if the shifted sub-band signals are of equal bandwidth, the sub-band combiner 503 sums a plurality of instantaneous samples of the shifted sub-band signals with zero shift amount and with non-zero shift amounts at each sample period to generate a zero-shifting sub-band summation signal and a non-zero-shifting sub-band summation signal respectively. Then, the sub-band combiner 503 adds the zero-shifting sub-band summation signal underwent a linear filtering operation and the non-zero shift sub-band summation signal to generate the audio output signal, expressed as:

$$\begin{cases} y_U[n] = \sum_{v \in V} y_{SHF,v}[n] \\ y_V[n] = \sum_{v \in V} y_{SHF,v}[n] \end{cases}, \quad (13)$$

$$y[n] = y_U[n] + C_{CMP} \cdot y_U[n-D] + y_V[n], D = \text{round}\left(\frac{f_{SAM}}{BW}\right) \quad (14)$$

wherein U denotes a set of No. of all shifted sub-band signals with zero shift amount, V denotes a set of No. of all shifted sub-band signals with non-zero shift amount, $y_U$ denotes the zero-shifting sub-band sum signal (i.e., sum of the shifted sub-band signals of set U), $y_V$ denotes the non-zero-shifting sub-band sum signal (i.e., sum of the shifted sub-band signals of set V), y denotes an audio output signal of the audio frequency shifting system 500, BW denotes the bandwidth of the shifted sub-bands, $C_{CMP}$ denotes an adjustable parameter, round denotes the rounding function, and the remaining notations are as aforementioned. The output audio may be output to a digital-to-analog converter to generate an analog waveform, output to a storage device or other systems, or further up-sampled before being output.

The frequency responses (including gain responses and group delay responses) of the equivalent sub-band filters of the analysis filter bank 300 are highly similar in shape near the passband when the sub-bands are of equal width. Through summation, the overall gain response and group delay response of the analysis filter bank 300 exhibit periodic fluctuations, and the filtering operation of equation (14) is aimed to mitigate such effect. That is, adjusting the parameter $C_{CMP}$ in (14) may reduce the fluctuations of the overall responses (only for the sub-band signals with zero shift amount).

If the bandwidths of the shifted sub-band signals are not equal, or most (or all) shift amounts of the shifted sub-band signals are non-zero, the overall responses of the analysis filter bank 300 cannot be compensated by the filtering operation of (14). Therefore, the sub-band combiner 503 simply sums a plurality of instantaneous samples of the shifted sub-band signals at each sample period to generate the audio output signal, expressed as:

$$y[n] = \sum_{v=1}^{\hat{S}} y_{SHF,v}[n], \quad (15)$$

where the notations are as aforementioned.

Figure 6:
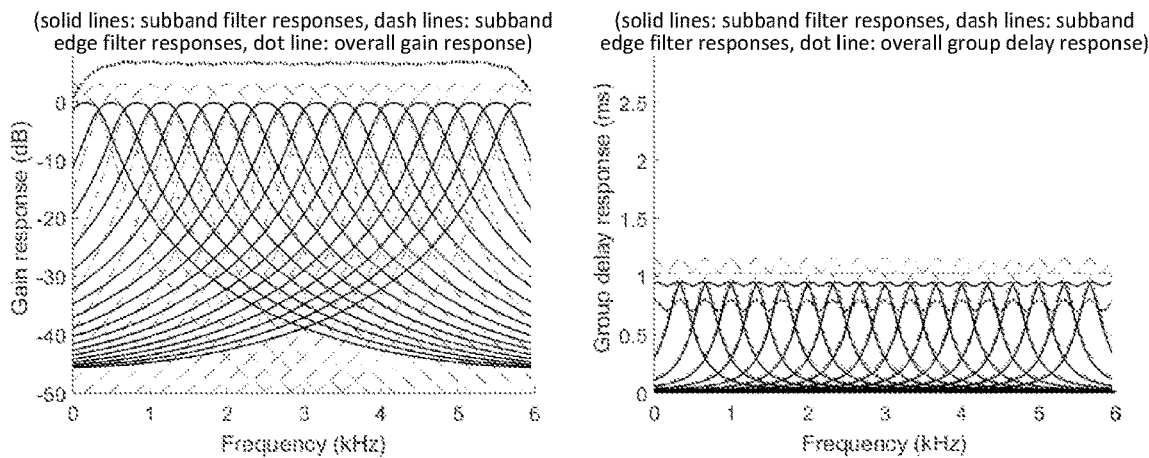
FIG. 6 is a response plot of an analysis filter bank of the present invention with equal-width sub-bands and employing first-order binomial combiners.

FIG. 6 is a response plot of an analysis filter bank of the present invention with equal-width sub-bands and employing first-order binomial combiners, wherein the solid lines denote the equivalent sub-band filter responses, and the dashed lines denote the equivalent filter responses corresponding to the lower sub-band-edge signals or the higher sub-band-edge signals, the dotted lines denote the overall responses of the analysis filter bank (i.e., the frequency responses obtained by combining the outputs of the equivalent sub-band filters with zero frequency shift amount. In a non-linear type FSC, the shift amount is typically zero in low frequency region, causing the frequency shifting operation behaves a linear filtering with said response in low-frequency). In this example, the sampling rate of the audio input signal is 12 kHz, and the frequency region from zero frequency (DC) to Nyquist frequency is divided into 18 sub-bands, so the width of each sub-band is 333 Hz. The combiner configuration of the analysis filter bank 300 is set as M=1 and $\hat{M}$=2. Thus, the analysis filter bank 300 requires 21 first-order IIR sub-filters, each sub-band signal is composed of two sub-filter signals, and the center frequencies of the two corresponding IIR sub-filters with the same bandwidth are located at the boundaries between the sub-band and the adjacent two sub-bands. In addition, each of the lower sub-band-edge signals and the higher sub-band-edge signals is composed of three sub-filtered signals, wherein the No. s higher sub-band-edge signal is the same as the No. s+1 lower sub-band-edge signal.

Figure 7:
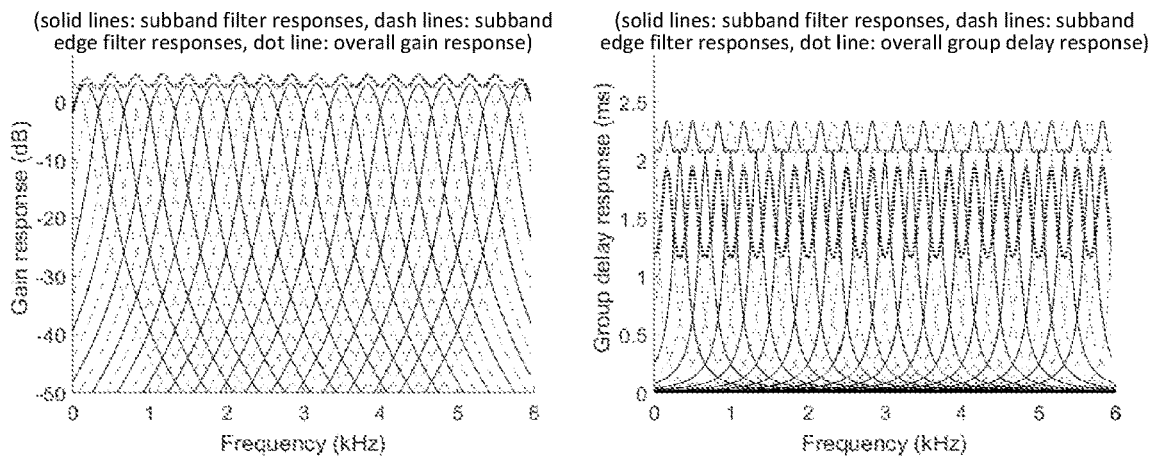
FIG. 7 is a response plot of an analysis filter bank of the present invention employing second-order binomial combiners.

FIG. 7 is a response plot of an analysis filter bank of the present invention employing second-order binomial combiners, where the sampling rate of the audio input signal, the number of sub-bands, and the sub-band width of the analysis filter bank are all equal to the settings of the above example. The combiner configuration of the analysis filter bank 300 is M=$\hat{M}$=2. Thus, the analysis filter bank 300 requires 39 first-order IIR sub-filters, and each of the sub-band signals is composed of three of the sub-filter signals. The center frequencies of two of the three IIR sub-filters are located at the boundaries between the sub-band and the adjacent two sub-bands, and the center frequency of the remaining IIR sub-filter is located at the center of the sub-band. In addition, each of the lower sub-band-edge signals and the higher sub-band-edge signal is composed of three of the sub-filtered signals, and the No. s higher sub-band-edge signal is the same as the No. s+1 lower sub-band-edge signal. To make the figures clear, fewer sub-bands are employed in the two examples. From the two examples it can be seen that the transition band of the gain response of the equivalent sub-band filters of the analysis filter bank employing the second-order binomial combiner is narrower than that of the analysis filter bank employing the first-order binomial combiner, while the stop band attenuation is stronger as well. The price for obtaining such better response characteristic is that the number of complex-type multiplications is almost doubled, and the filter group delay is also doubled.

Figure 8:
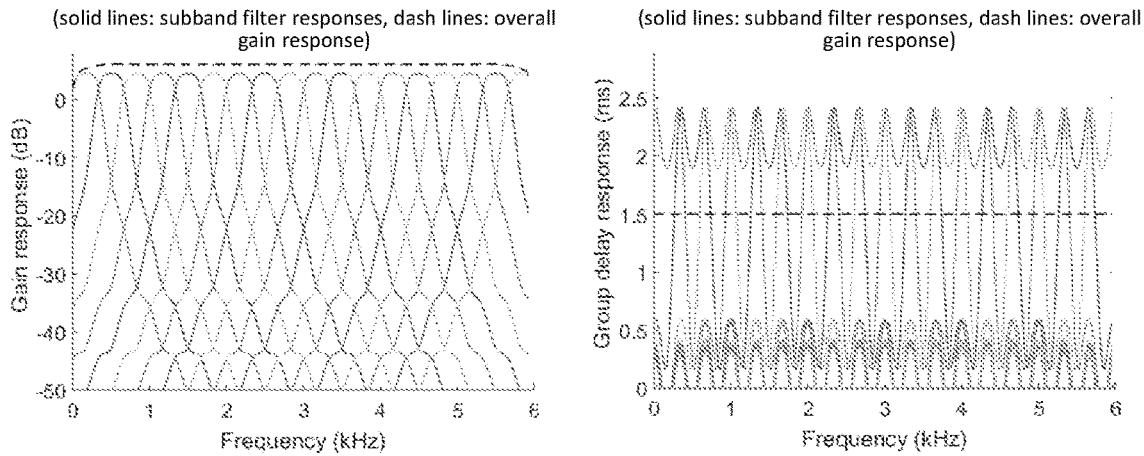
FIG. 8 is a response plot of the analysis filter bank of the present invention employing second-order binomial combiners with response compensation.

FIG. 8 is a response plot of the analysis filter bank of the present invention employing second-order binomial combiners with response compensation, wherein the solid lines denote the equivalent sub-band filter responses, and the dashed lines denote the overall responses of the analysis filter bank. The configuration of the analysis filter bank is almost identical to that of the example shown in FIG. 7 except the enabled response compensation. It can be seen that through the simple filtering operation of (14), the overall response is flatter than that shown in FIG. 7.

The following explains the known difference between the frequency shifting system of the first embodiment and the aforementioned Rollers algorithm:

Difference in the way of determining the shift amounts: In the Rollers algorithm, the shift amount of each sub-band signal is determined based on the center frequency of the corresponding sub-band. An issue arising with this approach is that each frequency component of the input signal may appear at the outputs of multiple sub-band filters adjacent in center frequency, where the shift amounts respectively corresponding to the sub-band filters are different. Consequently, an obvious low-frequency interference referred to as beat is introduced by combining the shifted sub-band signals. A countermeasure to mitigate the issue is to increase the number of sub-bands to reduce the sub-band width. Through this, the frequency of the beat will be reduced, the response overlapping of adjacent sub-band filters will be decreased, and the intensity of interference components will be reduced accordingly. However, increasing the number of sub-bands directly increases the computational complexity and the group delay of the filter bank. Reducing the response overlapping of adjacent sub-band filters causes a worse attenuation on signal near the sub-band edges, which requires to increase the order of the sub-band filters to alleviate such effect (with the cost of raising both the computational complexity and the processing delay). Therefore, the countermeasure are not generally preferred in system design. By contrast, in the audio frequency shifting system 500, the shift amount of each sub-band signal is determined according to the fine input spectrum. Since the sub-band signal frequencies of the two adjacent sub-bands are roughly equal when the frequency of a sound component locates between the center frequencies of the two sub-bands, this design reduces the probability of beat introduced after combining the shifted signals, and it also avoids the issues introduced by reducing the sub-band width or reducing the response overlapping of adjacent sub-band filters. Another unique feature of the design of the first embodiment is that the highly shared IIR sub-filters of the analysis filter bank in the present invention, which greatly reduces the overhead of computing the higher/lower sub-band-edge signals.

Difference in the way of generating the complex-type sub-band signals: In the Rollers algorithm, a real-type filter bank is employed. Each sub-band signal requires a Hilbert transform or its approximate operation to generate a complex-type signal for the subsequent frequency shifting operation. In addition, the real-type filter bank faces the numerical accuracy issue, i.e., higher numerical precision is required as the filter cut-off frequency is closer to the DC or Nyquist frequency, thus implementing the filter bank in fixed-point arithmetic with a lower word length is likely to cause significant distortion. By contrast, the analysis filter bank 300 of the audio frequency shifting system 500 employs complex-type filters to generate the complex-type sub-band signals. Therefore, the frequency shifting and weighting device 502 does not need to implement Hilbert transform or its approximate operation, nor does it have to face the numerical precision issue.

Difference in filter bank architecture: In the Rollers algorithm, each sub-band filter of the filter bank employs a conventional real-type fourth-order Butterworth filter, where its gain response possesses a flat passband and fast roll-off transition bands. By contrast, the audio frequency shifting system 500 employs the analysis filter bank designed for the audio frequency shifting system, which reduces the computational complexity by using paralleled IIR sub-filters and combining the output signals of these sub-filters. For example, when a real-type fourth-order Butterworth sub-band filter plus an all-pass filter for real-to-complex conversion (as in the Rollers algorithm) is employed, an average of 13 real-type multiplications are calculated to obtain each sub-band signal. By contrast, when the aforementioned design of first-order or second-order binomial weighted analysis filter bank is employed in the audio frequency shifting system 500, an average of 1 or 2 complex-type multiplications (each corresponds to 4 real-type multiplications) are calculated to obtain each sub-band signal. In addition, under the same sub-band width setting, the overall group delay response of the system, regardless of employing either the first-order or the second-order binomial weighted analysis filter bank, is lower than the group delay of the fourth-order Butterworth-type sub-band filter.

Difference on FSC support: Regarding to the Rollers algorithm, Reference 4 only demonstrates a one-to-one frequency mapping capability, and directly sums the shifted sub-band signals to generate the audio output signal. In contrast, the audio frequency shifting system 500 of the present invention supports a one-to-many mapping relationship, and the sub-band signals are weighted in addition to being shifted to adjust the relative strength of the shifted sub-band signals.

When implementing the audio frequency shifting system 500, it should be noted that:

If the analysis filter bank 300 employs an equal-width sub-band configuration, the IIR sub-filters 301 have the same bandwidth and their filter center frequencies are equally spaced on the frequency axis. In this way, the values of all $b_k$ are identical and the multiplication of $b_k$ can be moved outside equation (1), e.g., by multiplying the audio input signal by $b_k$ before passing it to the analysis filter bank 300, to further reduce the computations of the IIR sub-filters 301.

The analysis filter bank 300 may employs an unequal-width sub-band configuration, and the aforementioned filter bank equations (1) to (10) are still applicable in such configuration.

Figure 9:
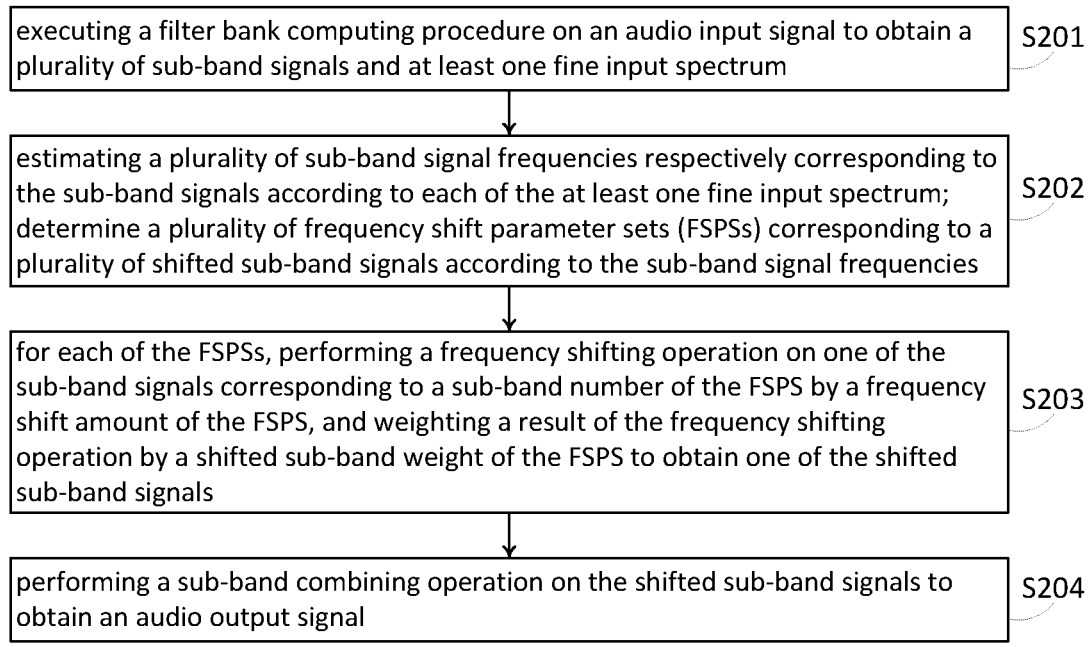
FIG. 9 is a flowchart of an audio frequency shifting procedure of a second embodiment of the present invention.

In addition to being implemented by a physical device, the functions of the audio frequency shifting system 500 can also be implemented by an equivalent computing procedure executed on at least one processor. FIG. 9 is a flowchart of an audio frequency shifting procedure of a second embodiment of the present invention. The flow steps focus on the processing method of a segment of a continuous audio signal, because the signal is segmentally processed for each step to support a real-time audio application. In describing the steps of the audio frequency shifting procedure, equations (11) to (15) and their corresponding paragraphs are referred.

In FIG. 9, a filter bank computing procedure is executed on at least one sample of an audio input signal to obtain multiple sub-band signals and at least one fine input spectrum (step S201). Refer to paragraphs [0022] to [0026] for the filter bank computing procedure.

A plurality of sub-band signal frequencies respectively corresponding to the sub-band signals are estimated according to each fine input spectrum, and a plurality of FSPSs corresponding to a plurality of shifted sub-band signals are determined according to the sub-band signal frequencies (step S202). More specifically, for each sub-band signal, the envelope of the sub-band signal, the envelope of the lower sub-band-edge signal, and the envelope of the higher sub-band-edge signal of the fine input spectrum are substituted into equation (11) to estimate the corresponding sub-band signal frequency. Then, the sub-band signal frequencies are substituted into a FSC to determine the FSPSs, each of the FSPSs includes a sub-band number, a shift amount, and a shifted sub-band weight. Refer to paragraph [0031] for more detail.

For each FSPS, a frequency shifting operation is performed on one of the sub-band signals corresponding to a sub-band number of the FSPS by a shift amount of the FSPS, and a result of the frequency shifting operation is weighted by a shifted sub-band weight of the FSPS to obtain one of the shifted sub-band signals (step S203), which includes at least one sample. For the detail of frequency shifting and weighting operation, equation (12) and paragraphs [0033] to [0034] can be referred. The initial phase of each shifted sub-band signal is determined according to the center frequency of the corresponding sub-band.

A sub-band combining operation is performed on the shifted sub-band signals to obtain at least one sample of an audio output signal (step S204). After that, the procedure returns to step S200 for the next segment of the audio input signal. Referring to equations (13) to (14) and paragraphs [0035] to [0036], if the shifted sub-band signals are of equal bandwidth, a plurality of instantaneous samples of the shifted sub-band signals with zero shift amount and with non-zero shift amounts are summed at each sample period to obtain a zero-shifting sub-band summation signal and a non-zero-shifting sub-band summation signal respectively, and the zero-shifting sub-band summation signal underwent a linear filtering operation and the non-zero-shifting sub-band summation signal are added to obtain at least one sample of an audio output signal. If the bandwidths of the shifted sub-band signals are not equal, or most (or all) shift amounts of the shifted sub-band signals are non-zero, a plurality of instantaneous samples of the shifted sub-band signals at each sample period are summed as equation (15) to obtain at least one sample of the audio output signal.

Although the audio frequency shifting system of the first embodiment and the audio frequency shifting procedure of the second embodiment employ a very efficient analysis filter bank and a filter bank computing procedure thereof, their computational complexity is still significantly higher than that of the audio frequency shifting systems that employs frequency-domain signal processing. This is because the fast-computing methods of the time-to-frequency transforms such as discrete Fourier transform (hereinafter abbreviated as DFT), short-time Fourier transform (hereinafter abbreviated as STFT), do exist, which achieve an efficiency much higher than that of the frequency-division filtering based on filter banks. Therefore, the audio frequency shifting system based on the filter bank and the audio frequency shifting procedure based on the filter bank computing procedure still have room for improvement. The following embodiment refines the aforementioned filter-bank based architecture to further reduce the computational complexity with the cost of slightly increasing the processing delay.

Figure 10:
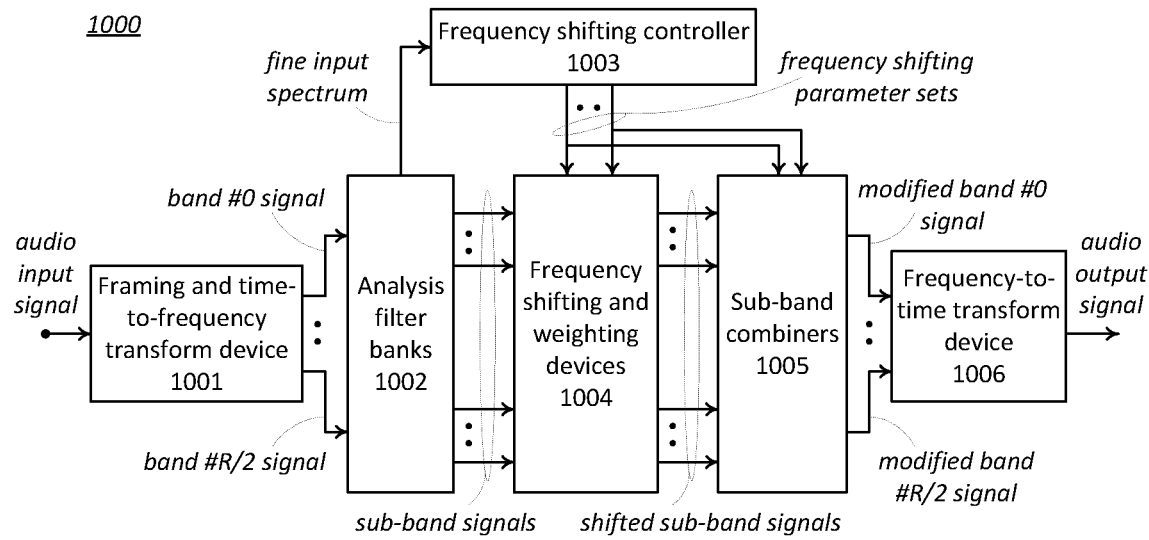
FIG. 10 is a block diagram of a hybrid audio frequency shifting system of a third embodiment of the present invention.

FIG. 10 is a block diagram of a hybrid audio frequency shifting system of a third embodiment of the present invention. The hybrid audio frequency shifting system 1000 comprises a framing and time-to-frequency transform device 1001, multiple paralleled analysis filter banks 1002, a frequency shifting controller 1003, multiple frequency shifting and weighting devices 1004, and multiple sub-band combiners 1005, and a frequency-to-time transform device 1006.

The framing and time-to-frequency transform device 1001 divides an audio input signal into multiple audio frames with a frame length of R samples and a frame spacing of N samples ($N \leq R/2$), and performs an R-point time-tofrequency transform (such as STFT, DFT, etc.) on each audio frame to generate one of a plurality of spectrums. The R-point time-to-frequency transform is functionally equivalent to separate a full band (from DC to the audio sampling rate $f_{SAM}$) into R equal-width narrowband signal and decimate the narrowband signals by a factor of N. Therefore, a plurality of bin values of the spectrums at a frequency bin (i.e., corresponding to the same frequency) form one of a plurality of band signals, where the sampling rate of the band signals is reduced to $f_{SAM}/N$. If the R-point time-to-frequency transform is an R-point STFT, it can be expressed as:

$$x_{BAND,g}[h] = \sum_{r=0}^{R-1} x[hN+r] \cdot W_{ANA}(r) \cdot \exp\left(-j \cdot \frac{2\pi rg}{R}\right), \quad (16)$$

$$\forall g \in [0, R-1]$$

where g denotes the frequency band index, h denotes the frame index, which is also the time index of the band signals, $x_{BAND,g}$ denotes the No. g band signal, x denotes an audio input signal, $W_{ANA}(\cdot)$ denotes the analysis window function of the R-point STFT with non-zero value when the input falls within the range of [0, R−1], and the remaining notations are as aforementioned. The STFT and its inverse transform can refer to Reference 5. Moreover, since the audio signal is of real type, the audio spectrum values on both sides of the Nyquist frequency are conjugate symmetric. Therefore, the system only needs to calculate one side of the spectrum, and then take the complex conjugate values to form the other side of the spectrum. For simplicity, the frequency-domain signal processing operations can be performed only on the band signals of No. 0 to R/2.

The analysis filter banks 1002 respectively perform frequency-division filtering and envelope detection on the No. 0 to R/2 band signals to generate S sub-band signals and No. 0 to R/2 band spectrums in total. For the detail of operation, equations of the analysis filter bank 300 in the first embodiment and corresponding paragraphs are referred. Since the input of each analysis filter bank in this embodiment is a narrowband band signal, the fine spectrum generated by the analysis filter banks are referred to as band spectrums to emphasize the narrow frequency range property. The band spectrums at each frame period are further lumped as a fine input spectrum covering the entire frequency range of the input signal.

The frequency shifting controller 1003 estimates multiple sub-band signal frequencies respectively corresponding to the sub-band signals according to the fine input spectrum, wherein the No. s sub-band signal frequency can be estimated as:

$$\tilde{f}_{SB,s}[h] = f_{SB,s} + C_{CFO,s} \cdot \frac{u_{U,s}[h] - u_{L,s}[h]}{u_{U,s}[h] + u_{C,s}[h] + u_{L,s}[h]}, \forall s \in [1, S] \quad (17)$$

where h denotes the time index of the sub-band signals, and the rest notations are as aforementioned.

Then, the frequency shifting controller 1003 substitutes the sub-band signal frequencies into a FSC (allowing one-to-many mapping) for subsequent frequency shifting operations, wherein the No. s sub-band signal is frequency shifted to generate the No. $\hat{S}_{s-1}+1$ to $\hat{S}_s$ shifted sub-band signal. After the S sub-band signals are frequency shifted, a total number of S shifted sub-band signals are generated ($\hat{S}_1=1$, $\hat{S}_s \geq \hat{S}_{s-1}+1$, and $\hat{S}_s=\hat{S}$). In general, the frequency shifting controller 1003 determines S FSPSs respectively corresponding to the S shifted sub-band signals according to the S sub-band signal frequencies, and each of the FSPSs includes a sub-band number, a shift amount, a shifted sub-band weight, and a shifted band number. In the following equation, the time index of the FSPSs and the time index of the shifted sub-band signals are set equal to simplify the representation.

Compared with the FSPSs determined by the frequency shifting controller 501 of the first embodiment, each FSPS determined by the frequency shifting controller 1003 further includes a shifted band number. The reason is that the frequency shifting range of the frequency shifting and weighting devices 1004 is reduced to $f_{SAM}/N$ as the sampling rate of the sub-band signals, and the bandwidth of the band signals (i.e., the upper bound of the bandwidth of the sub-band signals) is reduced to $f_{SAM}/R$. However, a shift amount specified by the FSC may far exceed $f_{SAM}/N$ or $f_{SAM}/R$. Therefore, it is necessary to divide the designated shift amount into an inter-band shift amount and an intra-band shift amount, where the inter-band shift amount is the difference between the center frequency of the band after the frequency shifting and the center frequency of the band before the frequency shifting, the intra-band shift amount is the designated shift amount minus the inter-band shift amount, and the inter-band shift amount should minimize the absolute value of the intra-band shift amount. In addition, the inter-band shift amount is only for easy explanation. The equivalent information actually used is the No. of the frequency band to which a sub-band signal is shifted, which is referred to as shifted band number. Hereinafter an intra-band shift amount is still referred to as a shift amount.

Each of the frequency shifting and weighting devices 1004 corresponding to one of the frequency shift parameter sets performs a frequency shifting operation on one of the sub-band signals corresponding to a sub-band number of the FSPS by a shift amount of the FSPS, and weights a result of the frequency shifting operation by a shifted sub-band weight of the FSPS to generate one of the shifted sub-band signals. The frequency shifting operation and the weighting operation can be expressed as:

$$y_{SHF,v}[h] = y_{FB,s}[h] \cdot w_v[h] \cdot \exp\left[j \cdot \left(\theta_v + \frac{2\pi N}{f_{SAM}} \sum_{t=0}^{h} f_{SHF,v}[t]\right)\right], \quad (18)$$

$$\forall v \in [\hat{S}_{s-1}+1, \hat{S}_s], s \in [1, S]$$

where the notations are as aforementioned. The initial phase setting $\theta_v$ of the shifted sub-band signal is the same as in the first embodiment, which can be determined by the sub-band center frequency of a corresponding sub-band signal, for example, setting $\theta_v$ to be proportional to the sub-band number.

Each of the sub-band combiners 1005 performs a sub-band combining operation on a subset of the shifted sub-band signals corresponding to a shifted band number to generate one of a plurality of modified band signals. Specifically, if the shifted sub-band signals in the subset are of equal bandwidth, the sub-band combiner sums a plurality of instantaneous samples of the shifted sub-band signals in the subset with zero shift amount and with non-zero shift amounts at each sample period to generate a zero-shifting sub-band summation signal and a non-zero-shifting sub-band summation signal respectively. The zero-shifting sub-band summation signal underwent a linear filtering operation and the non-zero-shifting sub-band summation signal are added to generate one of the modified band signals. In this way, the sub-band combining operation corresponding to the shifted band number g is expressed as:

$$\begin{cases} y_{U,g}[h] = \sum_{v \in U_g} y_{SHF,v}[h] \\ y_{V,g}[h] = \sum_{v \in V_g} y_{SHF,v}[h] \end{cases}, \forall g \in [0, R/2] \quad (19)$$

$$y_{BAND,g}[h] = y_{U,g}[h] + C_{CMP,g} \cdot y_{U,g}[h - D_g] + y_{V,g}[h],$$

$$D_g = \text{round}\left(\frac{f_{SAM}}{N \cdot BW_g}\right), \forall g \in [0, R/2] \quad (20)$$

where $U_g$ denotes a subset of the numbers of the shifted sub-band signals corresponding to shifted band number g and a zero shift amount, and $V_g$ denotes a subset of the numbers of the shifted sub-band signals corresponding to shifted band number g and non-zero shift amounts, $y_{U,g}$ denotes the No. g zero-shifting sub-band summation signal, $y_{V,g}$ denotes the No. g non-zero-shifting sub-band summation signal, $y_{BAND,g}$ denotes the No. g modified band signal, $BW_g$ denotes the bandwidth of the No. g shifted sub-band, $C_{CMP,g}$ denotes an adjustable parameter for the No. g analysis filter bank, and the remaining notations are as aforementioned. The setting of the parameter $C_{CMP,g}$ of (20) is to minimize the fluctuations of the overall response of the No. g analysis filter bank.

If there is no shifted sub-band signal in the subset with zero shift amount, or the bandwidths of the shifted sub-band signals in the subset with zero shift amount are not equal, the sub-band combiner sums a plurality of instantaneous samples of the subset of the shifted sub-band signals at each sample period to generate one of the modified band signals. In this way, the sub-band combining operation can be expressed as a simple summation:

$$y_{BAND,g}[h] = \sum_{v \in U_g \cup V_g} y_{SHF,v}[h], \forall g \in [0, R/2] \quad (21)$$

where the notations are as aforementioned. Moreover, if there is no shifted sub-band signal corresponding to the shifted band number g (i.e., $U_g$ and $V_g$ in (20) are both empty), the combining operation is not required, and $y_{BAND,g}[h]=0$ is set.

The frequency-to-time transform device 1006 performs an R-point frequency-to-time transform (which is an inverse operation of the R-point time-to-frequency transformation) on a plurality of instantaneous samples of the modified band signals at each frame period to generate an output audio signal. Since the audio spectrum shows conjugate symmetry on both sides of the Nyquist frequency, the complex conjugate values of the modified band signals of the single side spectrum are used as the modified band signals on the symmetric side of the spectrum:

$$y_{BAND,R-g}[h] = \overline{y_{BAND,g}[h]}, \forall g \in [1, R/2 - 1] \quad (22)$$

The R-point frequency-to-time transform can adopt the weighted overlap-add method (i.e., an inverse transform of R-point STFT as in (16)) to generate the audio output signal, which can be expressed as:

$$y_h[n] = \sum_{g=0}^{R-1} \text{real}\left\{y_{BAND,g}[h] \cdot \exp\left(j \cdot \frac{2\pi g n}{R}\right)\right\}, \quad (23)$$

$$y[n] = \sum_{h=-\infty}^{\infty} y_h[n - hN] \cdot W_{SYN}(n - hN), \quad (24)$$

where $y_h$ denotes the No. h modified signal frame, y denotes the audio output signal, $W_{SYN}(\cdot)$ denotes the synthesis window function of the R-point weighted overlap-add method with non-zero value when the input falls within the range of [0, R−1], and the remaining notations are as aforementioned.

The hybrid audio frequency shifting system 1000 reduces the sampling rate of each analysis filter bank through inserting the time-frequency transform pair. Under the condition of equal number of sub-bands, the computational complexity of each sub-band of the third embodiment is greatly reduced compared with that of the first embodiment. On the other hand, the processing delay of this system is dominated by the group delay of the analysis filter banks plus the processing delay of the time-to-frequency transform and the inverse transform thereof, which is about one frame period. Since increasing the frame length of the time-to-frequency transform also increases the processing delay of the system, the frame length selection still a trade-off between the computational complexity and the processing delay at system level (it is desired to select an appropriate frame length to reduce the computational complexity of the system to approach that of a STFT-based audio frequency shifting system, while improve the processing delay of the system to an acceptable level). For example, considering that an audio frequency shifting system of the first embodiment divides the audio input signal with 12 kHz sampling rate in 128 sub-bands, the algorithmic delay (10.7 ms) is approximately one-half of the algorithmic delay of a frequency-domain audio frequency shifting system with a similar spectral resolution (21.3 ms), while the number of complex-type multiplications is roughly twenty times of that of the frequency-domain audio frequency shifting system. However, for the hybrid audio frequency shifting system of the third embodiment with the similar spectral resolution, the algorithmic delay is about 1~3 ms higher than that of the audio frequency shifting system of the first embodiment (depending on the frame length setting), and the number of complex-type multiplications can be reduced to about two to three times of that of the frequency-domain audio frequency shifting system. Therefore, it has considerable potential in delay-sensitive applications.

Figure 11:
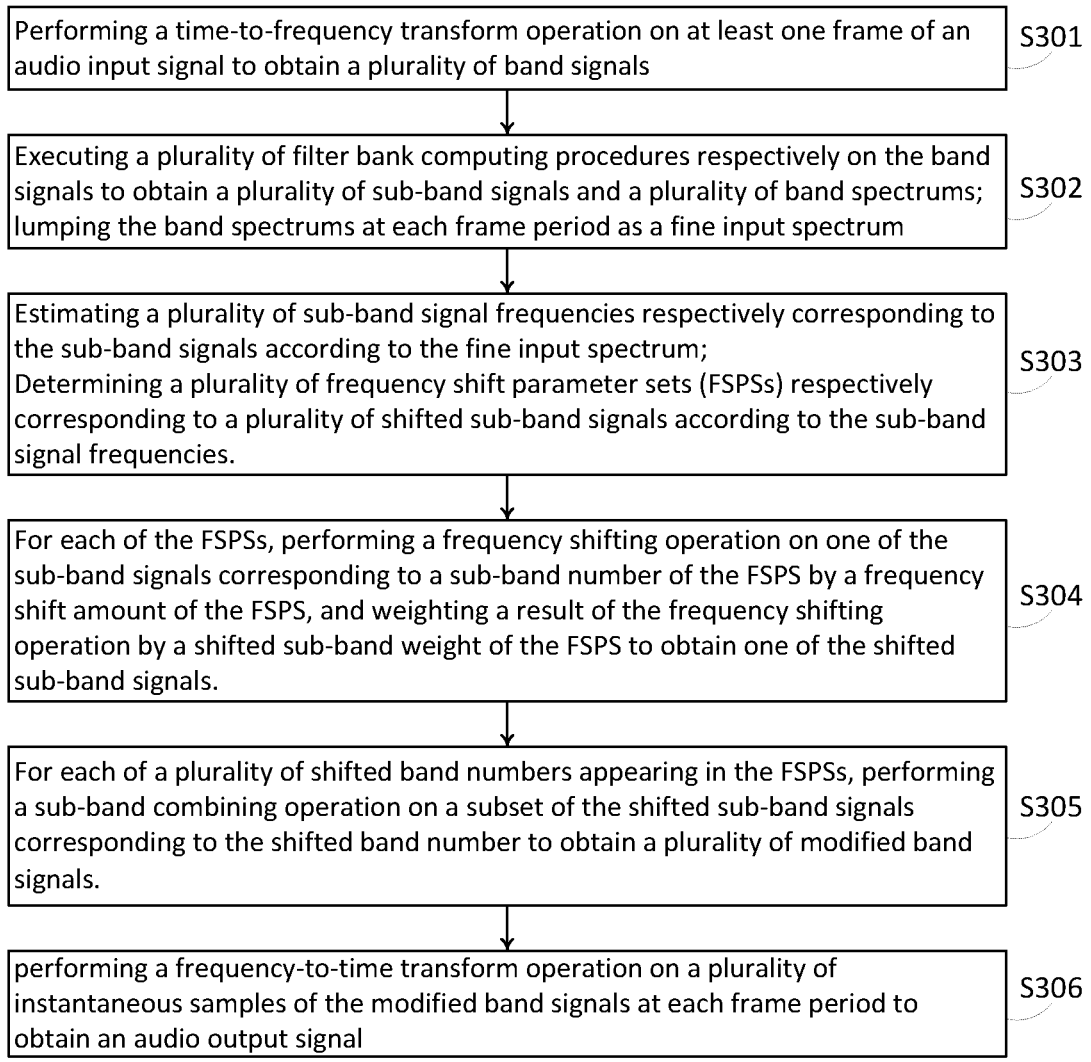
FIG. 11 is a flowchart of a hybrid audio frequency shifting procedure of a fourth embodiment of the present invention.

In addition to being implemented by a physical device, the functions of the hybrid audio frequency shifting system 1000 can also be implemented by an equivalent computing procedure executed on at least one processor. FIG. 11 is a flowchart of a hybrid audio frequency shifting procedure of a fourth embodiment of the present invention. In describing the steps of the hybrid audio frequency shifting procedure, equations (16) to (24) and their corresponding paragraphs are referred. The flow steps focus on the processing method of a segment of a continuous audio signal, because the signal is segmentally processed for each step to support a real-time audio application.

In FIG. 11, a time-to-frequency transform operation is performed on at least one frame of an audio input signal to obtain multiple band signals respectively corresponding to multiple frequency bands (step S301). For the time-to-frequency transform operation, equation (16) and paragraph

[0050] can be referred. Each band signal includes at least one spectrum sample corresponding to a frequency band.

A plurality of filter bank computing procedures are executed on a plurality of band signals respectively to obtain a plurality of sub-band signals and a plurality of band spectrums, and the band spectrums at each frame period are lumped as a fine input spectrum (step S302). Refer paragraphs [0022] to [0026] and [0051] for the filter bank computing procedures. Each sub-band signal includes at least one sample.

A plurality of sub-band signal frequencies respectively corresponding to the sub-band signals are estimated according to the fine input spectrum, and a plurality of FSPSs respectively corresponding to the shifted sub-band signals are determined according to the sub-band signal frequencies (step S303). More specifically, for each sub-band signal, the envelope of the sub-band signal, the envelope of the lower sub-band-edge signal, and the envelope of the higher sub-band-edge signal of the fine input spectrum are substituted into equation (17) to estimate the corresponding sub-band signal frequency. Then, the sub-band signal frequencies are substituted into a FSC to determine the FSPSs, each of the FSPSs includes a sub-band number, a shift amount, a shifted sub-band weight, and a shifted band number. Refer to paragraph [0053] for more detail.

For each FSPS, a frequency shifting operation is performed on one of the sub-band signals corresponding to a sub-band number of the FSPS by a shift amount of the FSPS, and a result of the frequency shifting operation is weighted by a shifted sub-band weight of the FSPS to obtain one of the shifted sub-band signals (step S304), which includes at least one sample. Refer to equation (18) and paragraph [0055] for more detail of the above operations. The initial phase of each shifted sub-band signal is determined according to the center frequency of the corresponding sub-band.

For each of a plurality of shifted band numbers appearing in the FSPSs, a sub-band combining operation on a subset of the shifted sub-band signals corresponding to the shifted band number is performed to obtain one of a plurality of modified band signals (step S305), which includes at least one sample. Referring to equations (19) to (20) and paragraphs [0056] to [0057], if the shifted sub-band signals in the subset are of equal bandwidth, a plurality of instantaneous samples of the shifted sub-band signals in the subset with zero shift amount and with non-zero shift amount are summed at each sample period to obtain a zero-shifting sub-band summation signal and a non-zero-shifting sub-band summation signal respectively, and the zero-shifting sub-band summation signal underwent a linear filtering operation and the non-zero-shifting sub-band summation signal are added to obtain one of the modified band signals, which includes at least one sample. If the bandwidths of the shifted sub-band signals in the subset with zero shift amount are not equal, or most (or all) of the shifted sub-band signals in the subset are with non-zero shift amounts, a plurality of instantaneous samples of the shifted sub-band signals in the subset at each sample period are summed as equation (21) to obtain one of the modified band signals.

A frequency-to-time transform operation is performed on a plurality of instantaneous samples of the modified band signals at each frame period to obtain a plurality of samples of an audio output signal (step S306). After that, the procedure returns to step S300 for the next segment of the audio input signal. For the frequency-to-time transform operation, equations (22) to (24) and paragraphs [0057] to [0058] can be referred.

Although the present invention has been described above with reference to the preferred embodiments and the accompanying drawings, it shall not be considered as limited. Those skilled in the art can make various modifications, omissions and changes to the details of the embodiments of the present invention without departing from the scope of the claims of the invention.

What is claimed is:

1. An analysis filter bank corresponding to a plurality of sub-bands, comprising:
    a plurality of sub-filters with different center frequencies which perform a plurality of complex-type first-order infinite impulse response (IIR) filtering operations on an input signal to generate a plurality of sub-filter signals;
    a first set of binomial combiners, each of which performs a weighted-sum operation on a first number of the sub-filter signals with a first set of binomial weights to generate one of a plurality of sub-band signals, wherein the first number of the sub-filter signals are generated by the first number of the sub-filters adjacent in center frequency;
    a second set of binomial combiners, each of which performs a weighted-sum operation on a second number of the sub-filter signals with a second set of binomial weights to generate one of a plurality of lower sub-band-edge signals or one of a plurality of higher sub-band-edge signals, wherein the second number of the sub-filter signals are generated by the second number of the sub-filters adjacent in center frequency; and
    a plurality of envelope detection with decimation devices which perform a plurality of envelope detection with decimation operations on the sub-band signals, the lower sub-band-edge signals, and the higher sub-band-edge signals to generate a plurality of fine spectrums.

2. The analysis filter bank according to claim 1, wherein two of the first set of binomial combiners corresponding to any two of the sub-bands adjacent in frequency share at least one of the sub-filter signals.

3. The analysis filter bank according to claim 1, wherein one of the first set of binomial combiners and one of the second set of binomial combiners both corresponding to one of the sub-bands share at least one of the sub-filter signals.

4. An audio frequency shifting system comprising an analysis filter bank according to claim 1, wherein the analysis filter bank performs frequency-division filtering and envelope detection on an input signal to generate a plurality of sub-band signals and a plurality of fine input spectrums, the audio frequency shifting system further comprising:
    a frequency shifting controller, which estimates a plurality of sub-band signal frequencies respectively corresponding to the sub-band signals according to each of the fine input spectrums, and determines a plurality of frequency shifting parameter sets (FSPSs) respectively corresponding to a plurality of shifted sub-band signals according to the sub-band signal frequencies;
    a plurality of frequency shifting and weighting devices, each of which corresponding to one of the FSPSs performs a frequency shifting operation on one of the sub-band signals corresponding to a sub-band number of the FSPS by a shift amount of the FSPS, and multiplies a result of the frequency shifting operation by a shifted sub-band weight of the FSPS to generate one of the shifted sub-band signals; and
    a sub-band combiner, which performs a sub-band combining operation on the shifted sub-band signals to generate an output signal.

5. The audio frequency shifting system according to claim 4, wherein the sub-band combining operation is to sum a plurality of instantaneous samples of the shifted sub-band signals with zero shift amount and with non-zero shift amounts at each sample period to generate a first signal and a second signal respectively, and to add the first signal underwent a linear filtering operation and the second signal to generate the output signal, or to sum the instantaneous samples of the shifted sub-band signals at each sample period to generate the output signal.

6. The audio frequency shifting system according to claim 4, wherein each of the sub-band signals corresponds to at least one of the shifted sub-band signals.

7. The audio frequency shifting system according to claim 4, wherein an initial phase of each of the shifted sub-band signals is determined by a center frequency of one of the sub-bands corresponding to the shifted sub-band signal.

8. An audio frequency shifting system comprising a plurality of analysis filter banks according to claim 1, wherein the analysis filter banks respectively perform frequency-division filtering and envelope detection on a plurality of band signals to generate a plurality of sub-band signals and a plurality of band spectrums, and the band spectrums at each frame period are lumped as a fine input spectrum, the audio frequency shifting system further comprising:

a framing and time-to-frequency transform device, which divides an input signal into a plurality of audio frames with equal frame length and equal frame spacing, and performs a time-to-frequency transform on each of the audio frames to generate the band signals;

a frequency shifting controller, which estimates a plurality of sub-band signal frequencies respectively corresponding to the sub-band signals according to the fine input spectrum, and determines a plurality of FSPSs corresponding to a plurality of shifted sub-band signals according to the sub-band signal frequencies;

a plurality of frequency shifting and weighting devices, each of which corresponding to one of the FSPSs performs a frequency shifting operation on one of the sub-band signals corresponding to a sub-band number of the FSPS by a frequency shift amount of the FSPS, and multiplies a result of the frequency shifting operation by a shifted sub-band weight of the FSPS to generate one of the shifted sub-band signals;

a plurality of sub-band combiners, each of which performs a sub-band combining operation on a subset of the shifted sub-band signals corresponding to a shifted band number to generate one of a plurality of modified band signals; and a frequency-to-time transform device, which performs a frequency-to-time transform on a plurality of instantaneous samples of the modified band signals at each frame period to generate an output signal.

9. The audio frequency shifting system according to claim 8, wherein each of the sub-band signals corresponds to at least one of the shifted sub-band signals.

10. The audio frequency shifting system according to claim 8, wherein an initial phase of each of the shifted sub-band signals is determined by a center frequency of one of the sub-bands corresponding to the shifted sub-band signal.

11. A filter bank computing procedure corresponding to a plurality of sub-bands, comprising the following steps:

performing a plurality of complex-type first-order IIR filtering operations with different center frequencies on an input signal to obtain a plurality of sub-filtered signals;

selecting a plurality of first subsets of the sub-filtered signals, wherein each of the first subsets corresponding to one of the sub-bands contains a first number of the sub-filtered signals obtained from the first number of the filtering operations adjacent in center frequency, and for each of the first subsets, performing a weighted-sum operation on a plurality of instantaneous values of the first number of the sub-filtered signals in the subset at each sample period with a first set of binomial weights to obtain one of a plurality of sub-band signals;

selecting a plurality of second subsets of the sub-filtered signals, wherein each of the second subsets corresponding to a lower-frequency side or a higher-frequency side of one of the sub-bands contains a second number of the sub-filtered signals obtained by the second number of the filtering operations adjacent in center frequency, and for each of the second subsets, performing a weighted-sum operation on a plurality of instantaneous values of the second number of the sub-filtered signals in the subset at each sample period with a second set of binomial weights to obtain one of a plurality of lower sub-band-edge signals or one of a plurality of higher sub-band-edge signals; and performing a plurality of envelope detection with decimation operations on the sub-band signals, the lower sub-band-edge signals, and the higher sub-band-edge signals to obtain at least one fine spectrum.

12. An audio frequency shifting procedure, which comprises a step of executing a filter bank computing procedure according to claim 11 on an input signal to obtain a plurality of sub-band signals and at least one fine input spectrum, the audio frequency shifting procedure further comprises the following steps:

estimating a plurality of sub-band signal frequencies respectively corresponding to the sub-band signals according to each of the at least one fine input spectrum, and determining a plurality of FSPSs corresponding to a plurality of shifted sub-band signals according to the sub-band signal frequencies;

for each of the FSPSs, performing a frequency shifting operation on one of the sub-band signals corresponding to a sub-band number of the FSPS by a shift amount of the FSPS, and multiplying a result of the frequency shifting operation by a shifted sub-band weight of the FSPS to obtain one of the shifted sub-band signals; and performing a sub-band combining operation on the shifted sub-band signals to obtain an output signal.

13. The audio frequency shifting procedure according to claim 12, wherein the sub-band combining operation is to sum a plurality of instantaneous samples of the shifted sub-band signals with zero shift amount and with non-zero shift amounts at each sample period to obtain a first signal and a second signal respectively, and to add the first signal underwent a linear filtering operation and the second signal to generate the output signal, or to sum the instantaneous samples of the shifted sub-band signals at each sample period to obtain the output signal.

14. The audio frequency shifting procedure according to claim 12, wherein each of the sub-band signals corresponds to at least one of the shifted sub-band signals.

15. The audio frequency shifting procedure according to claim 12, wherein an initial phase of each of the shifted sub-band signals is determined by a center frequency of one of the sub-bands corresponding to the shifted sub-band signal.

16. An audio frequency shifting procedure, which comprises a step of executing a plurality of filter bank computing procedures according to claim 11 respectively on a plurality of band signals to obtain a plurality of sub-band signals and a plurality of band spectrums, and lumping the band spectrums at each frame period as a fine input spectrum, the audio frequency shifting procedure further comprises the following steps:
  performing a time-to-frequency transform operation on at least one frame of an input signal to obtain the band signals;
  estimating a plurality of sub-band signal frequencies respectively corresponding to the sub-band signals according to the fine input spectrum, and determining a plurality of FSPSs respectively corresponding to a plurality of shifted sub-band signals according to the sub-band signal frequencies;
  for each of the FSPSs, performing a frequency shifting operation on one of the sub-band signals corresponding to a sub-band number of the FSPS by a shift amount of the FSPS, and multiplying a result of the frequency shifting operation by a shifted sub-band weight of the FSPS to obtain one of the shifted sub-band signals;
  for each of a plurality of shifted band numbers appearing in the FSPSs, performing a sub-band combining operation on a subset of the shifted sub-band signals corresponding to the shifted band number to obtain one of a plurality of modified band signals; and
  performing a frequency-to-time transform operation on a plurality of instantaneous samples of the modified band signals at each frame period to obtain an output signal.

17. The audio frequency shifting procedure according to claim 16, wherein each of the sub-band signals corresponds to at least one of the shifted sub-band signals.

18. The audio frequency shifting procedure according to claim 16, wherein an initial phase of each of the shifted sub-band signals is determined by a center frequency of one of the sub-bands corresponding to the shifted sub-band signal.

* * * * *